US011897698B2

(12) United States Patent
Nobuta et al.

(10) Patent No.: US 11,897,698 B2
(45) Date of Patent: Feb. 13, 2024

(54) ARTICLE TRANSPORT FACILITY

(71) Applicant: Daifuku Co., Ltd., Osaka (JP)

(72) Inventors: Seiya Nobuta, Hinocho (JP); Tadashi Nishikawa, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 339 days.

(21) Appl. No.: 17/462,440

(22) Filed: Aug. 31, 2021

(65) Prior Publication Data

US 2022/0073284 A1  Mar. 10, 2022

(30) Foreign Application Priority Data

Sep. 7, 2020  (JP) .................................. 2020-150065

(51) Int. Cl.
*B65G 43/02* (2006.01)
*B65G 35/06* (2006.01)

(52) U.S. Cl.
CPC ............. *B65G 43/02* (2013.01); *B65G 35/06* (2013.01); *B65G 2203/0266* (2013.01); *B65G 2203/045* (2013.01)

(58) Field of Classification Search
CPC .................... B65G 43/02; B65G 35/06; B65G 2203/0266; B65G 2203/045
See application file for complete search history.

(56) References Cited

U.S. PATENT DOCUMENTS

| 2015/0131233 | A1* | 5/2015 | Kawauchi | H05K 7/209 |
| | | | | 361/715 |
| 2016/0082843 | A1* | 3/2016 | Semsey | B60L 7/18 |
| | | | | 701/70 |
| 2020/0301413 | A1* | 9/2020 | Wengreen | G01K 13/00 |
| 2020/0379051 | A1* | 12/2020 | Myers | G01R 31/3648 |
| 2022/0304444 | A1* | 9/2022 | Wang | H05B 3/0033 |

FOREIGN PATENT DOCUMENTS

| JP | 59180609 | A | | 10/1984 | |
| JP | 3150083 | A | | 6/1991 | |
| JP | 1169609 | A | | 3/1999 | |
| JP | 2010035359 | A | * | 2/2010 | |
| JP | 2010093970 | A | * | 4/2010 | |
| JP | 2013135498 | A | * | 7/2013 | |
| JP | 2017131037 | A | * | 7/2017 | |
| JP | 2018190235 | A | | 11/2018 | |
| WO | WO-2010016176 | A1 | * | 2/2010 | ............. F04B 49/06 |
| WO | 2013115035 | A1 | | 8/2013 | |
| WO | 2019163052 | A1 | | 8/2019 | |

* cited by examiner

*Primary Examiner* — Scott Bauer
(74) *Attorney, Agent, or Firm* — The Webb Law Firm (57) ABSTRACT

A transport vehicle control system restricts a travel speed of an article transport vehicle to less than or equal to a restrictive speed prescribed in advance, in a case where a temperature sensor detects that the temperature of a regenerative resistor is greater than or equal to a first temperature set to a higher temperature than a steady temperature range which is a temperature range of a steady state prescribed in advance, and disconnects the connection between a power supply unit and a travel motor with a switch, in a case where the temperature sensor detects that the temperature of the regenerative resistor is greater than or equal to a second temperature set to a higher temperature than the first temperature.

8 Claims, 7 Drawing Sheets

ARTICLE TRANSPORT FACILITY

CROSS-REFERENCE TO RELATED APPLICATION

This application claims priority to Japanese Patent Application No. 2020-150065 filed Sep. 7, 2020, the disclosure of which is hereby incorporated by reference in its entirety.

BACKGROUND OF THE INVENTION

1. Field of the Invention

The present invention relates to an article transport facility provided with article transport vehicles that travel along a travel path and transport articles.

2. Description of the Related Art

Article transport vehicles that travel by driving a motor or the like through receiving power supply from a power supply line routed along the travel path are known. The motor functions as a power generator during deceleration, but since the regenerative power that is generated cannot be returned to the power supply line, a resistor (regenerative resistor) or the like may be used to consume this power. JP 3-150083A illustrates regenerative power being consumed by providing a regenerative resistor (3) on the DC side of an inverter (7) that drives AC rotating electrical machinery, and sending regenerative current to the regenerative resistor (3) (reference numerals in parentheses in this section are from the cited related art). The regenerative resistor generates heat due to the flow of regenerative current. Given the risk of the regenerative resistor failing when the temperature of the regenerative resistor rises over its rating, it is conceivable to perform control such as detecting that the temperature of the regenerative resistor has risen excessively with a temperature sensor and stopping the inverter, for example. However, when an article transport vehicle stops due to stoppage of the inverter, the article transport vehicle blocks the travel path, and thus other article transport vehicles can no longer pass along that path until the stopped article transport vehicle is removed, resulting in a drop in efficiency of the system as a whole. JP 3-150083A thus proposes suppressing the regenerative power of the inverter by estimating the rise in temperature of the regenerative resistor through measuring the current conduction period of the regenerative resistor.

SUMMARY OF THE INVENTION

The temperature of the regenerative resistor rises faster as the regenerative current increases, and rises faster as the time for which the regenerative current flows increases. Also, even when the rise in temperature is the same, it takes longer to exceed the rated temperature if the ambient temperature is low, and the rated temperature is reached in a shorter time if the ambient temperature is high. Accordingly, only measuring the current conduction period of the regenerative resistor is insufficient to appropriately estimate the temperature of the regenerative resistor.

In view of the above circumstances, it is desired to provide a technology for controlling a system appropriately according to the temperature of a regenerative resistor while suppressing a drop in system efficiency.

As one mode, an article transport facility made in view of the above and provided with an article transport vehicle that travels along a travel path and transports an article includes a transport vehicle control system configured to control the article transport vehicle, the article transport vehicle including a travel motor configured to drive a wheel, a power supply unit configured to supply power to the travel motor, a regenerative resistor configured to receive supply of regenerative power produced during regeneration of the travel motor, a temperature sensor configured to detect a temperature of the regenerative resistor, and a switch disposed on an electrical connection path between the power supply unit and the travel motor, and configured to shut off power supply from the power supply unit to the travel motor, and the transport vehicle control system, in a case where the temperature sensor detects that the temperature of the regenerative resistor is greater than or equal to a first temperature set to a higher temperature than a steady temperature range which is a temperature range of a steady state prescribed in advance, restricting a travel speed of the article transport vehicle to less than or equal to a restrictive speed prescribed in advance, and, in a case where the temperature sensor detects that the temperature of the regenerative resistor is greater than or equal to a second temperature set to a higher temperature than the first temperature, disconnecting the connection between the power supply unit and the travel motor with the switch.

According to this configuration, the temperature of the regenerative resistor including also the effect of ambient temperature is detected by a temperature sensor, and the article transport vehicle is controlled through selection between two different control states, based on the detected temperature. That is, the control state is selected according to whether the regenerative resistor is greater than or equal to a first temperature or greater than or equal to a second temperature that is higher than the first temperature. If the temperature of the regenerative resistor is greater than or equal to the second temperature, the electrical connection between the power supply unit and the travel motor is disconnected with a switch. If the temperature of the regenerative resistor is greater than or equal to the first temperature and less than the second temperature, travel is continued in a state where the travel speed of the article transport vehicle is restricted to less than or equal to a restrictive speed, without the electrical connection between the power supply unit and the travel motor being disconnected. In this way, the temperature rise of the regenerative resistor can be suppressed while maintaining the travel of the article transport vehicle, by restricting the travel speed of the article transport vehicle at the stage prior to disconnecting the electrical connection between the power supply unit and the travel motor. Accordingly, the possibility of travel of the article transport vehicle being stopped due to the temperature rise of the regenerative resistor can be reduced, and a drop in transport efficiency of the article transport facility is suppressed. Also, according to this configuration, the actual temperature of the regenerative resistor is detected by a temperature sensor rather than using a predicted value, and thus the article transport vehicle can be appropriately controlled according to the temperature of the regenerative resistor even when the ambient temperature changes. In this way, according to this configuration, the system can be appropriately controlled according to the temperature of the regenerative resistor, while suppressing a drop in system efficiency.

Other features and advantages of the article transport facility will become apparent from the following description of embodiments with reference to the drawings.

DETAILED DESCRIPTION OF PREFERRED EMBODIMENTS

Hereinafter, an embodiment of an article transport facility will be described based on the drawings. As shown in FIGS. 1 to 5, an article transport facility 200 is provided with a travel rail 2 installed along a travel path 1 by being supported in a suspended manner by a ceiling, and an article transport vehicle 3 that travels on the travel rail 2 along the travel path 1 by being supported in a suspended manner by the travel rail 2 and transports articles W. The article transport vehicle 3 transports FOUPs (Front Opening Unified Pods) for housing semiconductor substrates or reticles for housing photomasks or the like as the articles W, for example. In this embodiment, FOUPs are illustrated as the articles W. Also, in the following description, the direction parallel to the travel path 1 is a travel direction Y, and the direction parallel to the horizontal plane and orthogonal to the travel direction Y is a width direction X. An up-down direction Z is the direction orthogonal to the travel direction Y and the width direction X.

Figure 1:
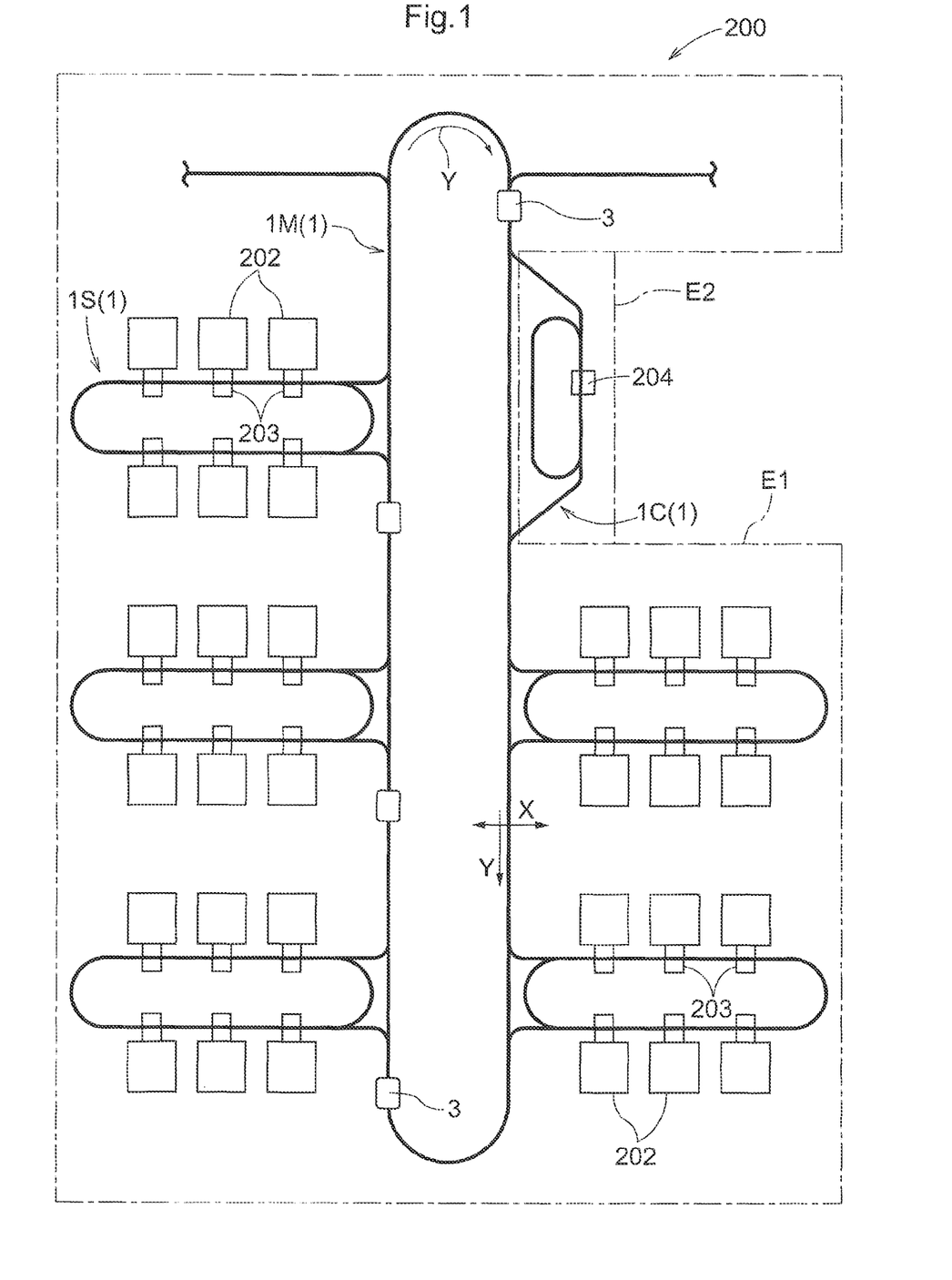
FIG. 1 is a plan view of an article transport facility.

As shown in FIG. 1, the travel path 1 is provided with, for example, one annular main path 1M, a plurality of annular sub-paths 1S that pass via a plurality of processing devices 202, and connecting paths that connect the main path 1M and sub-paths 1S. The travel path 1 is unidirectional, and the article transport vehicle 3 travels on the travel path 1 from the upstream side in the travel direction toward the downstream side in the travel direction. Also, the travel path 1 includes a transport area E1, which is an area through which the article transport vehicle 3 passes when transporting the article W, and a maintenance area E2, which is an area through which the article transport vehicle 3 passes when maintenance of the article transport vehicle 3 is performed. A maintenance lifter 204 for lifting the article transport vehicle 3 suspended from the travel rail 2 down to the ground in order to perform maintenance, for example, is disposed in the maintenance area E2.

Figure 2:
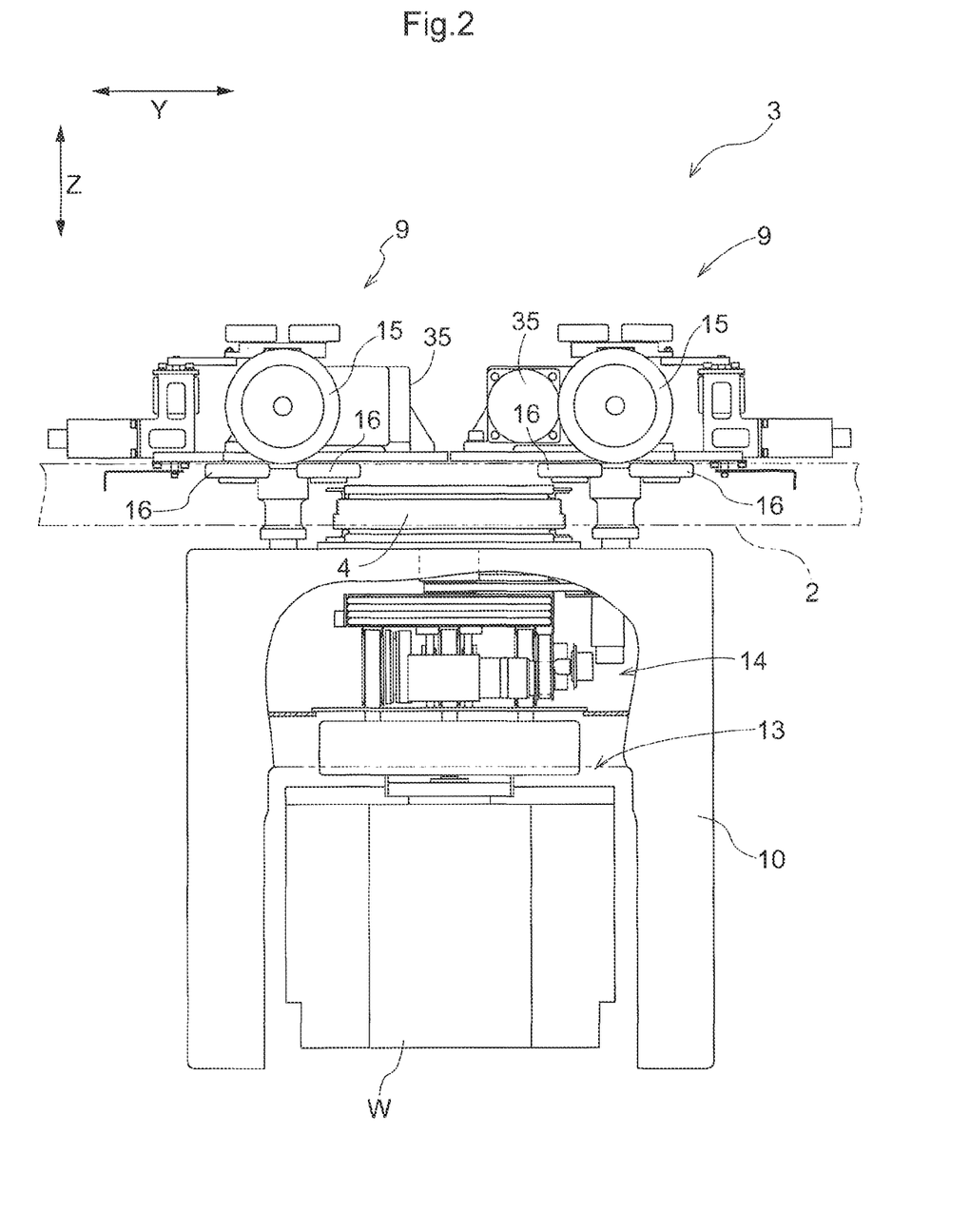
FIG. 2 is a side view of an article transport vehicle.
Figure 3:
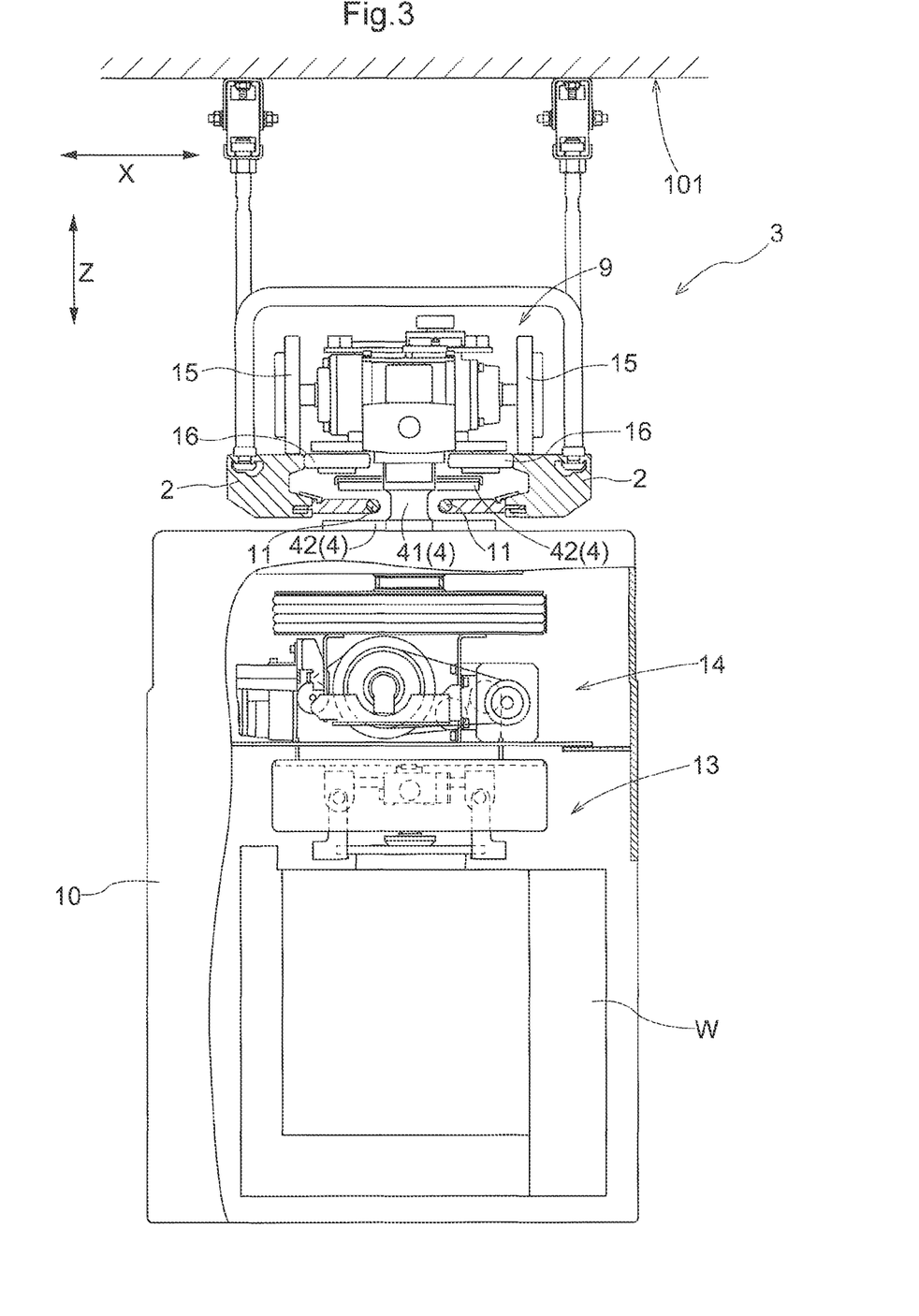
FIG. 3 is a front view of an article transport vehicle.

As shown in FIGS. 2 and 3, the article transport vehicle 3 is provided with a travel unit 9 that travels along the travel path 1 by being guided by a pair of travel rails 2 supportively disposed in a suspended manner from the ceiling along the travel path 1, a transport vehicle main body 10 that is located downward of the travel rails 2 and is supported in a suspended manner by the travel unit 9, and a power receiving unit 4 that contactlessly receives drive power from a power supply line 11 routed along the travel path 1. Also, the transport vehicle main body 10 is provided with an article holding unit 13 that holds the article W in a suspended manner, and a lifting unit 14 that raises and lowers the article holding unit 13. As shown in FIGS. 2 and 3, the article transport vehicle 3 transports the article W by traveling with the article holding unit 13 raised.

Figure 4:
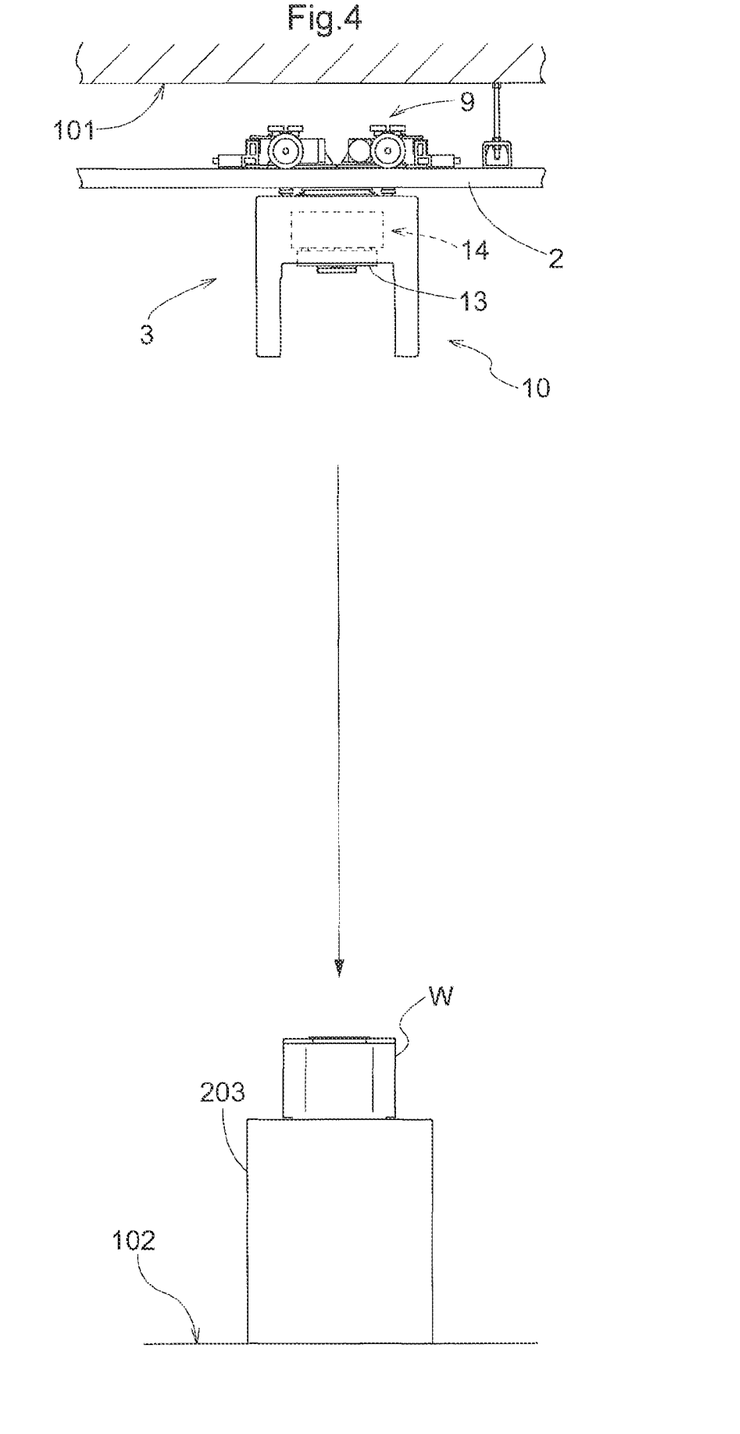
FIG. 4 is a diagram showing an example of transferring an article with an article transport vehicle.

As shown in FIG. 4, the article transport facility 200 is provided with a loading stand 203 that is installed on a floor 102 side and on which the article W is to be loaded. The article transport vehicle 3 transfers the article W to and from the loading stand 203 with the article holding unit 13 lowered. The loading stand 203 is disposed in a plurality of locations in the article transport facility 200. For example, the loading stand 203 is disposed in locations such as each of the processing devices 202 and an article storage that is outside of the area depicted in FIG. 1.

In the present embodiment, as shown in FIG. 3, one article transport vehicle 3 is provided with two travel units 9, and the common transport vehicle main body 10 is supported in a suspended manner by each of the travel units 9. The two travel units 9 have the same configuration, and each of the travel units 9 is provided with the power receiving unit 4, for example. The power receiving unit 4 corresponds to a power supply unit that supplies power to the article transport vehicle 3. The travel units 9 are disposed to be aligned in the travel direction Y of the article transport vehicle 3.

Figure 5:
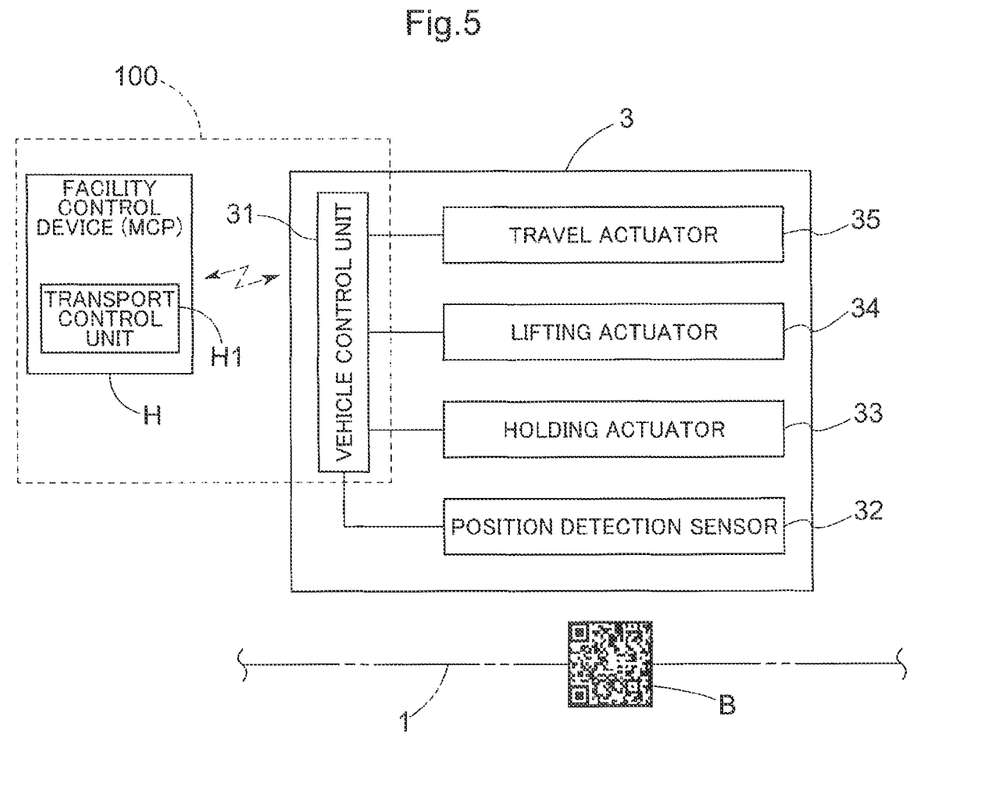
FIG. 5 is a schematic block diagram showing the configuration of the article transport facility.

As shown in FIGS. 2 and 3, each of the travel units 9 is provided with a pair of travel wheels 15 that are rotationally driven by an electric travel actuator 35 (see FIG. The travel actuator 35 is a motor (travel motor), for example. The travel wheels roll on a travel surface formed on the upper surface of each of the travel rails 2. Also, each of the travel units 9 is provided with a pair of guide wheels 16 that freely rotate about an axial center parallel to the up-down direction Z (about an up-down axial center) in a state of abutting the inner surface of the pair of travel rails 2. As shown in FIG. 5, the transport vehicle main body 10 is provided with actuators such as a lifting actuator 34 for raising and lowering the article holding unit 13 and a holding actuator 33 for driving the article holding unit 13 that holds the article W by gripping the article W, and a drive circuit that drives these actuators. Note that these actuators are motors, solenoids or the like, for example.

The article transport vehicle 3 transports the article W between different loading stands 203, based on a transport instruction from a facility control device H (MCP: Material Control Processor) that performs overall management of the article transport facility 200. In the present embodiment, the facility control device H and each of the article transport vehicles 3 are configured to be able to communicate with each other by wireless communication. Each of the article transport vehicles 3 is provided with a vehicle control unit 31, and transfers the article W by being caused to travel under autonomous control based on the transport instruction, and raise and lower the article holding unit 13 after stopping above the designated loading stand 203.

Also, a position indicator B that indicates a position on the travel path 1 is disposed along the travel path 1. The article transport vehicle 3 is provided with a position detection sensor 32 (position detection unit) that utilizes these plurality of position indicators B to detect positions on the travel path 1. The position indicators B can, for example, be configured as one-dimensional or two-dimensional barcodes or as markers on which numbers or characters are written. The position detection sensor 32 can be configured as a barcode reader, an image recognition device, or a character recognition device that recognizes numbers or characters. Position information detected by the position detection sensor 32 is conveyed to the vehicle control unit 31. The article transport vehicle 3 transmits the detected position information to a transport control unit H1, and the transport control unit H1 transmits a transport instruction generated based on the position information to the article transport vehicle 3.

As shown in FIG. 5, in the present embodiment, the transport control unit H1 provided in the facility control device H that controls transportation of the articles W by the plurality of article transport vehicles 3 and the vehicle control unit 31 provided in each of the article transport vehicles 3 are included as a transport vehicle control system 100 that controls the article transport vehicles 3. Bidirectional communication is possible between the facility control device H and each of the article transport vehicles 3.

In the present embodiment, the power receiving unit 4 supplies drive power to the article transport vehicle 3, using a wireless power supply technology called HID (High Efficiency Inductive Power Distribution Technology). Specifically, high frequency current is sent to the power supply line 11 which is an induction line, and a magnetic field is generated around the power supply line 11. The power receiving unit 4 is constituted to be provided with a pickup coil 41 and a magnetic core 42, and the pickup coil 41 is induced by electromagnetic induction from the magnetic field. The induced power is rectified by a full-wave rectifying circuit 43 (see FIG. 6). A smoothing capacitor 49 smooths a pulse that is produced by the full-wave rectifying circuit 43.

Figure 6:
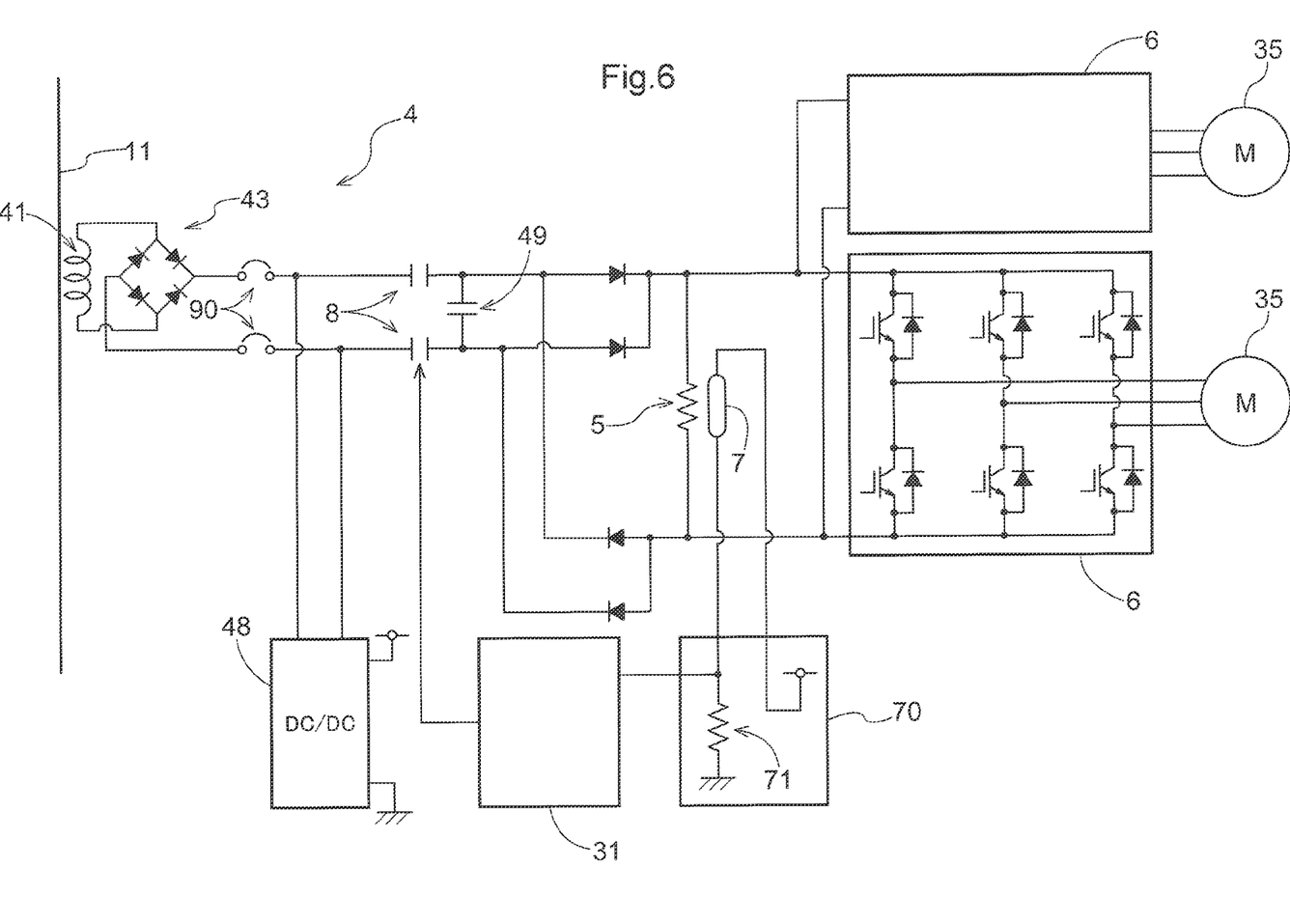
FIG. 6 is a circuit block diagram showing an example of a power receiving unit and a travel motor drive circuit.

FIG. 6 shows an example in which the travel actuator 35 of the travel unit 9 is driven with this power. In other words, the power receiving unit 4 corresponds to a power supply unit that supplies power to the travel actuator 35 (travel motor). The travel actuator 35 is an AC motor, and is driven via an inverter 6 that converts DC power rectified via the full-wave rectifying circuit 43 into AC power. The inverter 6 is constituted to be provided with a plurality of switching elements, and converts power between DC and AC, by switching in accordance with a switching control signal that is generated by the vehicle control unit 31 and input via a drive circuit which is not shown.

The power receiving unit 4 and the inverter 6 are electrically connected via a contactor 90 disposed on the power receiving unit 4 side and a switch 8 disposed on the inverter 6 side. The contactor 90 is a circuit protector (breaker), for example, and the switch 8 is a magnetic contactor such as an electromagnetic relay, for example. When at least one of the contactor 90 and the switch 8 is in an open state (OFF state), the electrical connection between the power receiving unit 4 and the inverter 6 is disconnected. ADC/DC converter 48, for example, is connected between the contactor and the switch 8, and voltages that are supplied to the vehicle control unit 31, the position detection sensor 32 (discussed later), and the like are generated. If the contactor 90 is in a non-open state (ON state), the DC/DC converter 48 is electrically connected to the power receiving unit 4 and is able to supply power to the vehicle control unit 31, the position detection sensor 32 (discussed later), and the like. Even when the contactor 90 is in the non-open state (ON state), the switch 8 is disposed on the electrical connection path between the power receiving unit 4 and the travel actuator 35 and is capable of shutting off power supply from the power receiving unit 4 to the travel actuator 35.

Incidentally, when the article transport vehicle 3 decelerates, the travel motor serving as the travel actuator 35 functions as a power generator, and regenerative current flows toward the power receiving unit 4 from the inverter 6. The regenerative current from the travel actuator 35 that is driven by power supplied from the power supply line 11 cannot return to the power supply line 11. A regenerative resistor 5 that receives supply of the regenerative power produced during regeneration of the travel actuator 35 is thus provided. The regenerative resistor 5 is connected between the anode and cathode on the DC side of the inverter 6, and the regenerative current is consumed as heat.

Here, in the case where a large amount of regenerative current is produced, the temperature of the regenerative resistor 5 rises. The temperature of the regenerative resistor 5 exceeding the operating temperature range may result in failure of the regenerative resistor 5 and failure of peripheral circuits of the regenerative resistor 5. A temperature sensor 7 that detects the temperature of the regenerative resistor 5 is thus provided. In the present embodiment, a temperature sensor 7 that uses an NTC thermistor whose resistance value decreases when the temperature rises is provided. The temperature sensor 7 is connected in series to a partial pressure resistor 71 provided in a temperature detection circuit 70, and the voltage of the connecting point between the temperature sensor 7 and the partial pressure resistor 71 is conveyed to the vehicle control unit 31 as a temperature detection value. As described above, bidirectional communication is possible between the vehicle control unit 31 and the facility control device H, and the temperature detection value can also be conveyed to the facility control device H.

For example, the voltage of the temperature detection value increases when the temperature of the regenerative resistor 5 rises. The vehicle control unit 31 is able to determine the state of the regenerative resistor 5, through comparison with a threshold value prescribed in advance. Also, in the case where a failure occurs in the temperature sensor 7, such a short circuit in the thermistor or the wiring of the thermistor, for example, the resistance value of the temperature sensor 7 decreases and the voltage of the temperature detection value increases. Also, when disconnection or the like occurs in the thermistor or the wiring of the thermistor, the resistance value of the temperature sensor 7 increases and the voltage of the temperature detection value decreases.

The transport vehicle control system 100 executes fail-safe control on the article transport vehicle 3, based on the temperature detection value. The temperature of the regenerative resistor 5 including also the effect of ambient temperature is appropriately detected by the temperature sensor 7, and the fail-safe control to be executed is selected, based on the detected temperature detection value. If the temperature sensor 7 detects that the temperature (TH (see FIG. 7)) of the regenerative resistor 5 is greater than or equal to a first temperature TH1 set to a higher temperature than a steady temperature range which is a temperature range in a steady state prescribed in advance, the transport vehicle control system 100 restricts the travel speed of the article transport vehicle 3 to less than or equal to a restrictive speed (first restrictive speed) prescribed in advance. Also, if the temperature sensor 7 detects that the temperature (TH) of the regenerative resistor 5 is greater than or equal to a second temperature TH2 set to a higher temperature than the first temperature TH1, the transport vehicle control system 100 disconnects the connection between the power receiving unit 4 and the travel actuator 35 with the switch 8. Also, if the temperature sensor 7 detects that the temperature of the regenerative resistor 5 is less than a third temperature TH3 set to a lower temperature than the steady temperature range, the transport vehicle control system 100 restricts the travel speed of the article transport vehicle 3 to less than or equal to a restrictive speed (second restrictive speed). Note that the first restrictive speed and the second restrictive speed may be the same speed, and may also be different speeds.

Figure 7:
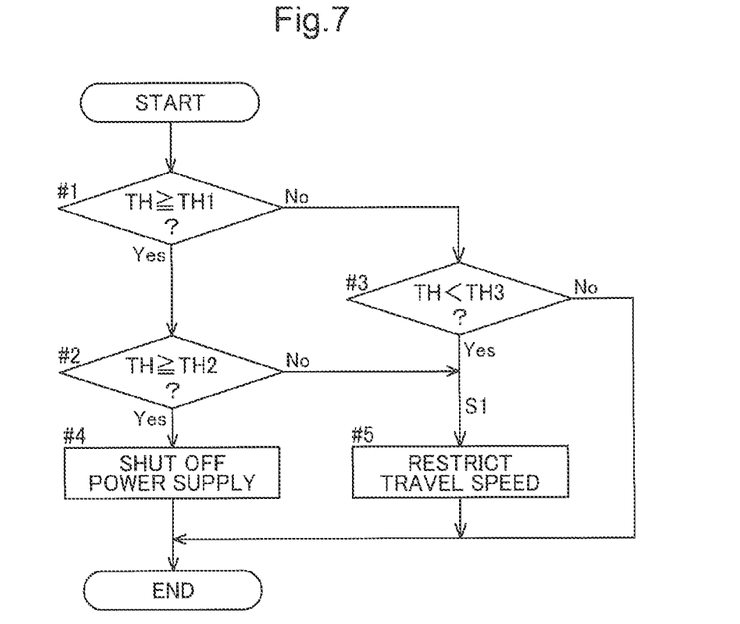
FIG. 7 is a flowchart showing an example of the relationship between the temperature of the regenerative resistor and control of an article transport vehicle.

The flowchart of FIG. 7 shows an example of the relationship between the temperature (TH) of the regenerative resistor 5 and control of an article transport vehicle 3. The transport vehicle control system 100 (in particular, vehicle control unit 31) determines whether the temperature (TH) of the regenerative resistor 5 is greater than or equal to the first temperature TH1 (#1), and, if determined to be greater than or equal to the first temperature TH1, next determines whether the temperature (TH) of the regenerative resistor 5 is greater than or equal to the second temperature TH2 (#2). If the temperature (TH) of the regenerative resistor 5 is determined to be less than the second temperature TH2, the vehicle control unit 31 restricts the travel speed to the first restrictive speed, for example (#5). If the temperature (TH) of the regenerative resistor 5 is determined in step #1 to be less than the first temperature TH1, the vehicle control unit 31 next determines whether the temperature (TH) of the regenerative resistor 5 is less than the third temperature TH3 (#3). If the temperature (TH) of the regenerative resistor 5 is less than the third temperature TH3, the vehicle control unit 31 restricts the travel speed to the second restrictive speed, for example (#5). When the temperature (TH) of the regenerative resistor 5 is determined in step #1 to be greater than or equal to the first temperature TH1 and is determined in step #2 to be greater than or equal to the second temperature TH2, the vehicle control unit 31 opens the switch 8 to disconnect the connection between the power receiving unit 4 and the travel actuator 35 and shut off power supply to the travel actuator 35 (#4).

If the temperature of the regenerative resistor 5 is greater than or equal to the second temperature TH2, the electrical connection between the power receiving unit 4 and the travel actuator 35 is disconnected, but if the temperature of the regenerative resistor 5 is greater than or equal to the first temperature TH1 and less than the second temperature TH2, travel is continued in a state where the travel speed of the article transport vehicle 3 is restricted, without the electrical connection between the power receiving unit 4 and the travel actuator 35 being disconnected. In this way, by restricting the travel speed of the article transport vehicle 3 at the stage prior to disconnecting the electrical connection between the power receiving unit 4 and the travel actuator 35, the temperature of the regenerative resistor 5 can be reduced or the speed of the temperature rise of the regenerative resistor 5 can be slowed, while maintaining the travel of the article transport vehicle 3. Accordingly, the possibility of travel of the article transport vehicle being stopped due to the temperature rise of the regenerative resistor can be reduced. A drop in transport efficiency of the article transport facility 200 is thus suppressed.

Also, as described above, when failure such as disconnection occurs in the temperature sensor 7 or the temperature detection circuit 70, the temperature detection value of the temperature sensor 7 may be markedly low. In such cases, there is a risk that the temperature of the regenerative resistor 5 may rise to exceed the rated range when the article transport vehicle 3 continues traveling due to the temperature of the regenerative resistor 5 being determined to be normal in step #1. If the temperature of the regenerative resistor 5 is less than the third temperature TH3, such a temperature rise can be suppressed when the travel speed of the article transport vehicle 3 is restricted.

Incidentally, when an article transport vehicle 3 whose travel speed has been restricted is allowed to continue traveling, the failure may possibly eventually reach the stage where travel is not possible. Also, the travel of an article transport vehicle 3 whose travel speed has been restricted hinders the travel of other article transport vehicles 3 whose travel speed has not been restricted, and may possibly cause problems such as traffic congestion of the article transport vehicles 3, for example, and lead to a reduction in transport efficiency. An article transport vehicle 3 whose travel speed has been restricted is thus preferably moved to the maintenance area E2. In the case where the article transport vehicle 3 is transporting an article W, however, it is favorable for the article transport vehicle 3 to be moved to the maintenance area E2 after transporting the article W that is being transported to the destination, so as to avoid creating work such as a worker carrying the article W to the transport destination or transferring the article W to another article transport vehicle 3.

Figure 8:
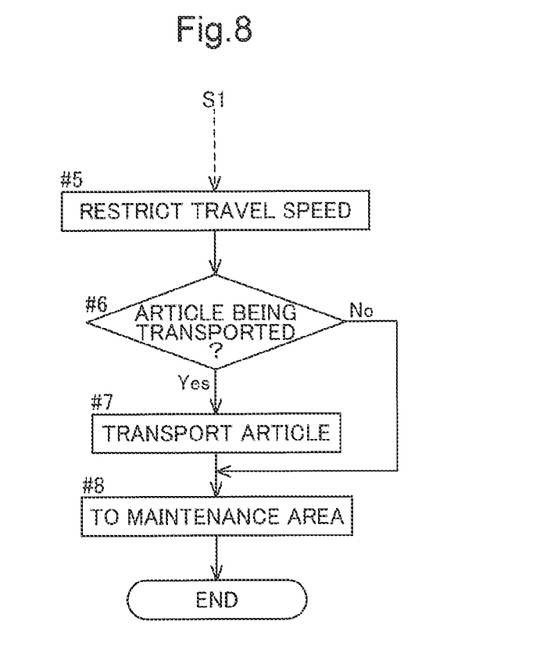
FIG. 8 is a flowchart showing an example of the relationship between the temperature of the regenerative resistor and control of an article transport vehicle.

The flowchart of FIG. 8 shows an example of the relationship between the temperature (TH) of the regenerative resistor 5 and control of an article transport vehicle 3. That is, the transport vehicle control system 100 restricts the travel speed of the article transport vehicle 3 to less than or equal to a restrictive speed based on the detection result of the temperature sensor 7 (#5), and, if the article transport vehicle 3 is transporting an article W (#6), allows the article transport vehicle 3 to transport the article W to the transport destination (#7), and then directs the article transport vehicle 3 to the maintenance area E2 (#8). Also, if the article transport vehicle 3 is not transporting an article W (#6), the transport vehicle control system 100 directs the article transport vehicle 3 straight to the maintenance area E2 (#8).

As described above, the transport vehicle control system 100 includes the transport control unit H1 provided in the facility control device H that controls transportation of the articles W by the plurality of article transport vehicles 3 and the vehicle control unit 31 provided in each of the article transport vehicles 3, and bidirectional communication is possible between the facility control device H and each of the article transport vehicles 3. The vehicle control unit 31 performs determination based on the detection result of the temperature sensor 7, transmission of regenerative resistor information that is based on at least one of the detection result and the determination result based on the detection result to the transport control unit H1, control of the travel speed of the article transport vehicle 3 based on the determination result, and control of the switch 8 based on the determination result. The transport control unit H1 receives the regenerative resistor information, and, if it is determined that the travel speed of the article transport vehicle 3 is restricted to less than or equal to a restrictive speed based on the regenerative resistor information, transmits a transport instruction specifying a point within the maintenance area E2 as the destination of the article transport vehicle 3 to the article transport vehicle 3.

The vehicle control unit 31 of each of the article transport vehicles 3 controls the travel speed and the like of the article transport vehicle 3 based on the temperature (TH) of the regenerative resistor 5, and is thus able to quickly control the article transport vehicle 3 after the temperature of the regenerative resistor 5 is detected. Also, the transport control unit H1 receives the regenerative resistor information that is based on at least one of the detection result of the temperature sensor 7 and the determination result based on the detection result, and, if the article transport vehicle 3 is transporting an article W, maintains the transport instruction of the article W, even in the case where it is determined that the travel speed of the article transport vehicle 3 is restricted. Accordingly, the article W being transported can be transported to the destination, without creating work such as a worker carrying the article W to the transport destination or transferring the article W to another article transport vehicle 3.

In the case where it is determined that the travel speed of the article transport vehicle 3 is restricted based on the received regenerative resistor information, the transport control unit H1 transmits a transport instruction specifying a point within the maintenance area E2 as the destination of the article transport vehicle 3 to the article transport vehicle 3, if the article transport vehicle 3 is not transporting an article W. The vehicle control unit 31 of the article transport vehicle 3 that receives the transport instruction travels toward the maintenance area E2 based on the transport instruction. If the article transport vehicle 3 is transporting an article W, the transport instruction of the article W is maintained as described above, and, after transportation, a transport instruction specifying a point within the maintenance area E2 as the destination of the article transport vehicle 3 is transmitted to the article transport vehicle 3. The vehicle control unit 31 of the article transport vehicle 3 that receives the transport instruction travels toward the maintenance area E2 based on the transport instruction.

At this time, the transport control unit H1 generates a transport instruction to travel toward the maintenance area E2, based on factors such as the position of the article transport vehicle 3, the shape in which the travel path 1 is arranged, and the position of other article transport vehicles 3, and transmits the generated transport instruction to the vehicle control unit 31. Accordingly, the transport control unit H1 is able to direct an article transport vehicle 3 whose travel speed has been restricted to the maintenance area E2 by a suitable path. For example, even in the case where the maintenance area E2 is set in a plurality of locations, the article transport vehicle 3 can be directed to an optimal maintenance area E2 based on position information.

OTHER EMBODIMENTS

Hereinafter, other embodiments will be described. Note that the configuration of each embodiment that will be described below is not limited to being applied independently, and can also be applied in combination with the configuration of other embodiments, as long as no conflicts arise.

(1) In the above, a ceiling transport vehicle supported in a suspended manner on the ceiling side is illustrated as the article transport vehicle 3. However, as long as the transport area E1 and the maintenance area E2 are included in the travel path 1 of the article transport facility, the article transport vehicle 3 may be a transport vehicle that travels on the ground side.

(2) In the above, FOUPs or reticles are illustrated as the articles W for transportation, but the articles W are not limited thereto and may be other articles.

(3) In the above, a configuration is illustrated in which, in the case where an article transport vehicle 3 whose travel speed has been restricted is transporting an article W, the article transport vehicle 3 is directed toward the maintenance area E2, after transporting the article W to the transport destination. However, even in this case, the article transport vehicle 3 is not precluded from being directed straight to the maintenance area E2.

(4) In the above, a configuration is illustrated in which the power receiving unit 4 that receives power supply from the power supply line 11 is provided as the power supply unit, but a configuration may be adopted in which a power storage device such as a battery is provided as the power supply unit.

SUMMARY OF THE EMBODIMENTS

Hereinafter, a brief summary of the article transport facility described above will be given.

As one mode, an article transport facility provided with an article transport vehicle that travels along a travel path and transports an article includes a transport vehicle control system configured to control the article transport vehicle, the article transport vehicle includes a travel motor configured to drive a wheel, a power supply unit configured to supply power to the travel motor, a regenerative resistor configured to receive supply of regenerative power produced during regeneration of the travel motor, a temperature sensor configured to detect a temperature of the regenerative resistor, and a switch disposed on an electrical connection path between the power supply unit and the travel motor, and configured to shut off power supply from the power supply unit to the travel motor, and the transport vehicle control system, in a case where the temperature sensor detects that the temperature of the regenerative resistor is greater than or equal to a first temperature set to a higher temperature than a steady temperature range which is a temperature range of a steady state prescribed in advance, restricting a travel speed of the article transport vehicle to less than or equal to a restrictive speed prescribed in advance, and, in a case where the temperature sensor detects that the temperature of the regenerative resistor is greater than or equal to a second temperature set to a higher temperature than the first temperature, disconnecting the connection between the power supply unit and the travel motor with the switch.

According to this configuration, the temperature of the regenerative resistor including also the effect of ambient temperature is detected by a temperature sensor, and the article transport vehicle is controlled through selection between two different control states, based on the detected temperature. That is, the control state is selected according to whether the regenerative resistor is greater than or equal to a first temperature or greater than or equal to a second temperature that is higher than the first temperature. If the temperature of the regenerative resistor is greater than or equal to the second temperature, the electrical connection between the power supply unit and the travel motor is disconnected with a switch. If the temperature of the regenerative resistor is greater than or equal to the first temperature and less than the second temperature, travel is continued in a state where the travel speed of the article transport vehicle is restricted to less than or equal to a restrictive speed, without the electrical connection between the power supply unit and the travel motor being disconnected. In this way, the temperature rise of the regenerative resistor can be suppressed while maintaining the travel of the article transport vehicle, by restricting the travel speed of the article transport vehicle at the stage prior to disconnecting the electrical connection between the power supply unit and the travel motor. Accordingly, the possibility of travel of the article transport vehicle being stopped due to the temperature rise of the regenerative resistor can be reduced, and a drop in transport efficiency of the article transport facility is suppressed. Also, according to this configuration, the actual temperature of the regenerative resistor is detected by a temperature sensor rather than using a predicted value, and thus the article transport vehicle can be appropriately controlled according to the temperature of the regenerative resistor even when the ambient temperature changes. In this way, according to this configuration, the system can be appropriately controlled according to the temperature of the regenerative resistor, while suppressing a drop in system efficiency.

Also, it is favorable for the transport vehicle control system, in a case where the temperature sensor detects that the temperature of the regenerative resistor is less than a third temperature set to a lower temperature than the steady temperature range, to restrict the travel speed of the article transport vehicle to less than or equal to the restrictive speed.

For example, when failure such as disconnection occurs in the temperature sensor, the temperature detection value of the temperature sensor may be markedly low. In such cases, there is a risk that the temperature of the regenerative resistor may rise to exceed the rated range when the article transport vehicle continues traveling due to the temperature of the regenerative resistor being determined to be normal. When the travel speed of the article transport vehicle is restricted to less than or equal to a restrictive speed, in the case where the temperature of the regenerative resistor is less than a third temperature that is lower than the steady temperature range, as in the present configuration, such a temperature rise can be suppressed. Note that the restrictive speed in this case may be the same speed as the case where the temperature of the regenerative resistor is greater than or equal to the first temperature, and may also be a different speed.

Also, it is favorable for the travel path to include a transport area which is an area through which the article transport vehicle passes when transporting the article, and a maintenance area which is an area through which the article transport vehicle passes when maintenance of the article transport vehicle is performed, and the transport vehicle control system to restrict the travel speed of the article transport vehicle to less than or equal to the restrictive speed based on a detection result of the temperature sensor, and to, in a case where the article transport vehicle is transporting the article, direct the article transport vehicle to the maintenance area, after the article has been transported to a transport destination, and, in a case where the article transport vehicle is not transporting the article, direct the article transport vehicle straight to the maintenance area.

When an article transport vehicle whose travel speed has been restricted is allowed to continue traveling, the failure may possibly eventually reach the stage where travel is not possible. Also, the travel of an article transport vehicle whose travel speed has been restricted hinders the travel of other article transport vehicles 3 whose travel speed has not been restricted, and may possibly cause problems such as traffic congestion of the article transport vehicles, for example, and lead to a reduction in transport efficiency. An article transport vehicle whose travel speed has been restricted is thus preferably moved to the maintenance area. According to this configuration, in the case where the article transport vehicle is not transporting an article, maintenance of the article transport vehicle can be quickly performed by directing the article transport vehicle straight to the maintenance area. Also, in the case where the article transport vehicle is transporting an article, the article transport vehicle is directed to the maintenance area after transporting the article to the transport destination, and thus maintenance of the article transport vehicle can be appropriately performed as well as being able to transport the article to the transport destination, without requiring work such as a worker carrying the article to the transport destination or transferring the article to another article transport vehicle.

Also, it is favorable for the transport vehicle control system to include a transport control unit provided in a facility control device that controls transportation of the article by a plurality of the article transport vehicle, and a vehicle control unit provided in each of the article transport vehicles, with bidirectional communication being possible between the facility control device and each of the article transport vehicles, the vehicle control unit to perform determination based on the detection result of the temperature sensor, transmission of regenerative resistor information that is based on at least one of the detection result and the determination result based on the detection result to the transport control unit, control of the travel speed of the article transport vehicle based on the determination result, and control of the switch based on the determination result, and the transport control unit to receive the regenerative resistor information, and, in a case where it is determined that the travel speed of the article transport vehicle is restricted to less than or equal to the restrictive speed based on the regenerative resistor information, to transmit a transport instruction specifying a point within the maintenance area as a destination of the article transport vehicle to the article transport vehicle.

According to this configuration, control of the travel speed and the like of the article transport vehicle based on the temperature of the regenerative resistor is performed by the vehicle control unit of the article transport vehicle itself, thus enabling the article transport vehicle to be quickly controlled after the temperature of the regenerative resistor is detected. Also, the transport control unit is able to direct the article transport vehicle whose travel speed has been restricted to the maintenance area by a suitable path.

Also it is favorable for the article transport vehicle to include a position detection unit configured to detect a position on the travel path, and to transmit detected position information to the transport control unit, and the transport control unit to transmit the transport instruction generated based on the position information to the article transport vehicle.

According to this configuration, even in the case where the maintenance area is set at a plurality of locations, for example, the article transport vehicle can be directed to an optimal maintenance area based on position information.

What is claimed is:

1. An article transport facility provided with an article transport vehicle that travels along a travel path and transports an article, the article transport facility comprising:
   a transport vehicle control system configured to control the article transport vehicle;
   wherein the article transport vehicle comprises:
   a travel motor to drive a wheel of the article transport vehicle;
   a power supply unit to supply power to the travel motor;
   a regenerative resistor to receive supply of regenerative power produced during regeneration of the travel motor;
   a temperature sensor to detect a temperature of the regenerative resistor; and
   a switch disposed on an electrical connection path between the power supply unit and the travel motor, and configured to shut off power supply from the power supply unit to the travel motor, and
   wherein the transport vehicle control system, in a case where the temperature sensor detects that the temperature of the regenerative resistor is greater than or equal to a first temperature set to a higher temperature than a steady temperature range which is a temperature range of a steady state prescribed in advance, restricts a travel speed of the article transport vehicle to less than or equal to a restrictive speed prescribed in advance, and wherein the transport vehicle control system, in a case where the temperature sensor detects that the temperature of the regenerative resistor is greater than or equal to a second temperature set to a higher temperature than the first temperature, disconnects the connection between the power supply unit and the travel motor with the switch.

2. The article transport facility according to claim 1, wherein the transport vehicle control system, in a case where the temperature sensor detects that the temperature of the regenerative resistor is less than a third temperature set to a lower temperature than the steady temperature range, restricts the travel speed of the article transport vehicle to less than or equal to the restrictive speed.

3. The article transport facility according to claim 1, wherein the travel path includes a transport area which is an area through which the article transport vehicle passes when transporting the article, and a maintenance area which is an area through which the article transport vehicle passes when maintenance of the article transport vehicle is performed, and wherein the transport vehicle control system restricts the travel speed of the article transport vehicle to less than or equal to the restrictive speed based on a detection result of the temperature sensor, wherein the transport vehicle control system, in a case where the article transport vehicle is transporting the article, directs the article transport vehicle to the maintenance area, after the article has been transported to a transport destination, and wherein the transport vehicle control system, in a case where the article transport vehicle is not transporting the article, directs the article transport vehicle straight to the maintenance area.

4. The article transport facility according to claim 2, wherein the travel path includes a transport area which is an area through which the article transport vehicle passes when transporting the article, and a maintenance area which is an area through which the article transport vehicle passes when maintenance of the article transport vehicle is performed, and wherein the transport vehicle control system restricts the travel speed of the article transport vehicle to less than or equal to the restrictive speed based on a detection result of the temperature sensor, where the transport vehicle control system, in a case where the article transport vehicle is transporting the article, directs the article transport vehicle to the maintenance area, after the article has been transported to a transport destination, and wherein the transport vehicle control system, in a case where the article transport vehicle is not transporting the article, directs the article transport vehicle straight to the maintenance area.

5. The article transport facility according to claim 3, wherein the transport vehicle control system comprises a transport control unit provided in a facility control device that controls transportation of the article by a plurality of the article transport vehicle, and a vehicle control unit provided in each of the article transport vehicles, with bidirectional communication being possible between the facility control device and each of the article transport vehicles, wherein the vehicle control unit performs determination based on the detection result of the temperature sensor, transmission of regenerative resistor information that is based on at least one of the detection result and the determination result based on the detection result to the transport control unit, control of the travel speed of the article transport vehicle based on the determination result, and control of the switch based on the determination result, and wherein the transport control unit receives the regenerative resistor information, and, in a case where it is determined that the travel speed of the article transport vehicle is restricted to less than or equal to the restrictive speed based on the regenerative resistor information, transmits a transport instruction specifying a point within the maintenance area as a destination of the article transport vehicle to the article transport vehicle.

6. The article transport facility according to claim 4, wherein the transport vehicle control system comprises a transport control unit provided in a facility control device that controls transportation of the article by a plurality of the article transport vehicle, and a vehicle control unit provided in each of the article transport vehicles, with bidirectional communication being possible between the facility control device and each of the article transport vehicles, wherein the vehicle control unit performs determination based on the detection result of the temperature sensor, transmission of regenerative resistor information that is based on at least one of the detection result and the determination result based on the detection result to the transport control unit, control of the travel speed of the article transport vehicle based on the determination result, and control of the switch based on the determination result, and wherein the transport control unit receives the regenerative resistor information and, in a case where it is determined that the travel speed of the article transport vehicle is restricted to less than or equal to the restrictive speed based on the regenerative resistor information, transmits a transport instruction specifying a point within the maintenance area as a destination of the article transport vehicle to the article transport vehicle.

7. The article transport facility according to claim 5, wherein the article transport vehicle comprises a position detection unit configured to detect a position on the travel path, and transmits detected position information to the transport control unit, and wherein the transport control unit transmits the transport instruction generated based on the position information to the article transport vehicle.

8. The article transport facility according to claim 6, wherein the article transport vehicle comprises a position detection unit configured to detect a position on the travel path, and transmits detected position information to the transport control unit, and wherein the transport control unit transmits the transport instruction generated based on the position information to the article transport vehicle.

* * * * *